(12) United States Patent
Chun

(10) Patent No.: US 7,145,489 B2
(45) Date of Patent: Dec. 5, 2006

(54) TESTER FOR A SEMICONDUCTOR DEVICE

(75) Inventor: Byoung-Ok Chun, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/101,412

(22) Filed: Apr. 8, 2005

(65) Prior Publication Data
US 2006/0087462 A1 Apr. 27, 2006

(30) Foreign Application Priority Data
Oct. 25, 2004 (KR) ...................... 10-2004-0085265

(51) Int. Cl.
*H03M 1/10* (2006.01)
(52) U.S. Cl. ...................... 341/120; 702/118
(58) Field of Classification Search ................ 341/120, 341/144, 155, 118; 324/500, 768; 714/724, 714/734; 702/118
See application file for complete search history.

(56) References Cited

U.S. PATENT DOCUMENTS

| | | | |
|---|---|---|---|
| 6,449,741 B1 * | 9/2002 | Organ et al. ................ | 714/724 |
| 6,462,532 B1 | 10/2002 | Smith ....................... | 324/158.1 |
| 6,557,131 B1 * | 4/2003 | Arabi ......................... | 714/734 |
| 6,690,189 B1 * | 2/2004 | Mori et al. .................. | 324/765 |
| 6,889,156 B1 * | 5/2005 | Pillai .......................... | 702/118 |
| 2003/0154047 A1 * | 8/2003 | Chun et al. ................. | 702/118 |
| 2005/0077905 A1 * | 4/2005 | Sasaki ........................ | 324/500 |

FOREIGN PATENT DOCUMENTS

| | | |
|---|---|---|
| KR | 2002-0060893 | 7/2002 |
| KR | 2003-0067890 | 8/2003 |

\* cited by examiner

*Primary Examiner*—Peguy JeanPierre
(74) *Attorney, Agent, or Firm*—Harness, Dickey & Pierce, P.L.C.

(57) ABSTRACT

A tester including a first module for testing a digital-to-analog conversion and a second module for testing an analog-to-digital conversion. The tester may include a controller for controlling operation of the first and second modules. The tester does not require a system bus, and modules may be swapped, added to the tester and/or removed from the tester based on application specific requirements.

19 Claims, 5 Drawing Sheets

TESTER FOR A SEMICONDUCTOR DEVICE

PRIORITY STATEMENT

This U.S. non-provisional application claims benefit of priority under 35 U.S.C. §119 of Korean Patent Application No. 2004-85265, filed on Oct. 25, 2004, the entire contents of which are incorporated herein by reference.

BACKGROUND OF THE INVENTION

1. Field of the Invention

Example embodiments of the present invention relate generally to a tester and method thereof, and more particularly, to a tester for a semiconductor device and method thereof.

2. Description of the Related Art

The electrical characteristics of semiconductor devices may be tested after fabrication. Semiconductor devices may be classified based on the type of electrical signals (e.g., digital, analog, etc.) included within the semiconductor devices (e.g., a digital semiconductor device, an analog semiconductor device, a mixed signal semiconductor device, etc.).

Testers for testing semiconductor devices may also be classified based on the electrical signals of the semiconductor devices. For example, a semiconductor device including a digital signal may be tested by a digital tester, a semiconductor device including an analog signal may be tested by an analog tester, and a semiconductor device including a mixed signal (e.g., analog and/or digital signals) may be tested by a mixed signal tester.

A mixed signal semiconductor device may be a system on chip (SOC) device. Mixed signal semiconductor devices have recently experienced increased demand due to newer technologies (e.g., music and video through a computer interface). A mixed signal tester may test analog signals and/or digital signals.

Conventional mixed signal testers may include a measurement module and a digital tester. The measurement module may not be included within the conventional digital tester. Rather, the measurement module may be connected to the digital tester through an interface (e.g., a TCP/IP communication).

A conventional tester (e.g., digital, analog, mixed, etc.) may require a system bus and a signal board suitable for the system bus. Thus, the conventional tester may require the fabrication of the system bus and the signal board. The development (e.g., the design, fabrication, etc.) of the system bus and the signal board may increase the cost of the conventional tester (e.g., digital, analog, mixed, etc.). Further, conventional testers may not be standardized. Thus, conventional testers produced by different manufacturers may be incompatible.

Although end-users may use the above-described conventional testers, end-users may have difficulty in designing and producing a suitable system bus and/or signal board to interact with the conventional testers. Thus, end-users may be limited to using off-the-shelf testers including the system bus and/or the signal board (e.g., which may be limited in compatibility).

SUMMARY OF THE INVENTION

An example embodiment of the present invention is directed to a tester for a semiconductor device, including a test head applying a test signal to a semiconductor device and receiving a response from the semiconductor device, the test head including a hot swappable chassis including at least one module and a device under test (DUT) board electrically connecting the test head and the semiconductor device.

Another example embodiment of the present invention is directed to a tester for a semiconductor device, including a first module for testing an analog-to-digital conversion (ADC) of the semiconductor device and a second module for testing a digital-to-analog conversion (DAC) of the semiconductor device, at least one of the first and second modules capable of being hot swappable.

DETAILED DESCRIPTION OF THE EXAMPLE EMBODIMENTS OF THE PRESENT INVENTION

Figure 1:
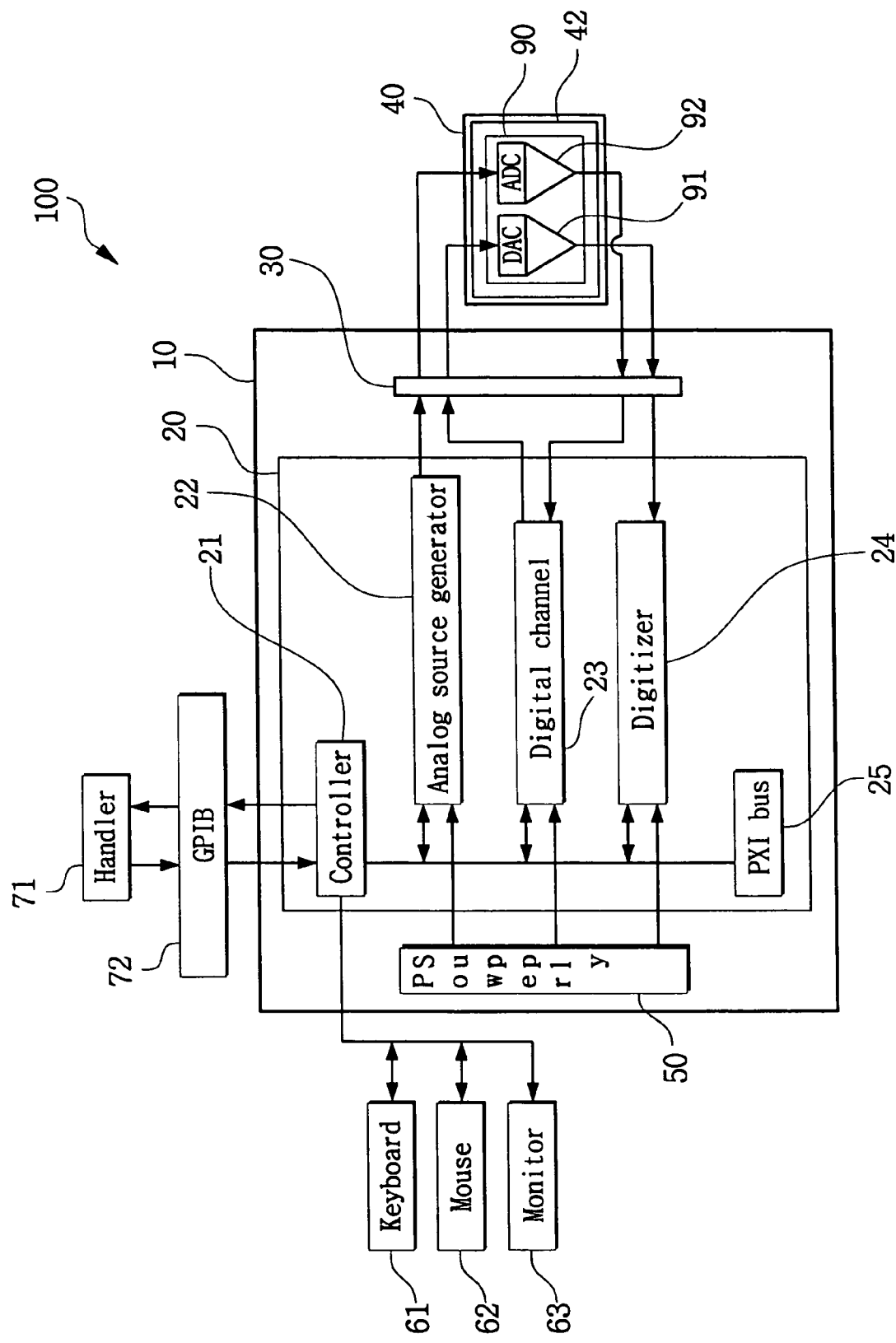
FIG. 1 is a block diagram illustrating a tester according to an example embodiment of the present invention.

Hereinafter, example embodiments of the present invention will be described in detail with reference to the accompanying drawings.

In the Figures, the same reference numerals are used to denote the same elements throughout the drawings.

FIG. 1 is a block diagram illustrating a tester 100 according to an example embodiment of the present invention.

Figure 2:
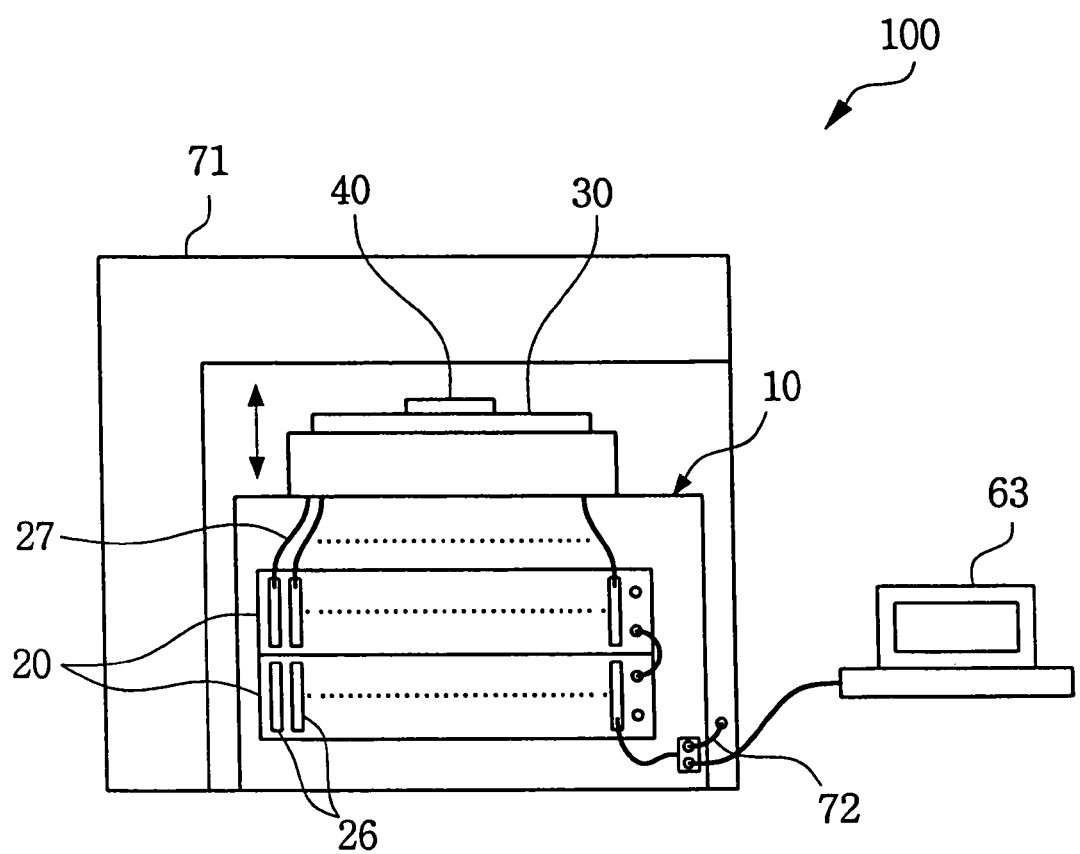
FIG. 2 illustrates a schematic view of the tester of FIG. 1.

FIG. 2 illustrates a schematic view of the tester 100 of FIG. 1.

In the example embodiment of FIGS. 1 and 2, the tester 100 may include a test head 10 and a device under test (DUT) board 40. The test head 10 may apply a test signal to a semiconductor device 90 and may receive an output signal from the semiconductor device 90. The DUT board 40 may electrically connect the test head 10 and the semiconductor device 90. A power supply 50 may supply power to components of the tester 100. A handler 71 may load the semiconductor device 90 on the DUT board 40. The handler 71 may perform operations on the semiconductor device 90 based on the test results received from the test head 10 after a test process on the semiconductor device 90. A manipulator (not shown) may vertically move the test head 10 to connect the test head 10 with the handler 71.

In the example embodiment of FIGS. 1 and 2, the test head 10 may include a PXI chassis 20 and a motherboard 30. The PXI chassis 20 may include a plurality of PXI modules 26. The PXI modules 26 may be configured to apply a test signal to the semiconductor device 90 and may receive an output signal from the semiconductor device 90. The received output signal may indicate a test passing or failure of the semiconductor device 90. A motherboard 30 may connect the PXI chassis 20 and the DUT board 40. The motherboard 30 may be electrically connected to the PXI modules 26 by an electrical connection (e.g., a cable 27).

In another example embodiment of the present invention, the PXI chassis 20 may include a plurality of PXI modules 26 in order to test both a digital test block and/or an analog test block. The PXI module 26 may further be expanded to include any number of PXI modules 26. Thus, although FIG. 2 illustrates two PXI chassis 20, other example embodiments of the present invention may not be limited to two PXI chassis 20.

In the example embodiment of FIGS. 1 and 2, a PXI module 26 may include an analog source generator 22, a digital channel 23, a digitizer 24, and/or a controller 21.

In the example embodiment of FIGS. 1 and 2, the PXI module 26 may correspond to a conventional signal board.

In the example embodiment of FIGS. 1 and 2, the analog source generator 22 may include an arbitrary wave form generator (AWG). The analog source generator 22 may output an analog signal to an analog-to-digital converter (ADC) 92 of the semiconductor device 90.

In another example embodiment of the present invention, the analog source generator 22 may operate at a speed of 43 MHz/16 bit or less.

In the example embodiment of FIGS. 1 and 2, the digital channel 23 may apply a digital signal to a digital-to-analog converter (DAC) 91 of the semiconductor device 90 and may receive a digital signal from the ADC 92 of the semiconductor device 90.

In another example embodiment of the present invention, the digital channel 23 may be expanded to any number of channels (e.g., 200 channels or more) based on an expansion of the PXI chassis 20.

In another example embodiment of the present invention, the digital channel 23 may operate at a speed of 50 MHz/8 Mb or less.

In another example embodiment of the present invention, the tester 100 may be based on an open or hot swappable architecture (e.g., a Peripheral Component Interconnect (PCI) Bus Extension for Instrumentation (PXI)).

In another example embodiment of the present invention, referring to FIGS. 1 and 2, the tester 100 may be designed to test a mixed signal semiconductor device (hereinafter referred to as a mixed signal tester).

In another example embodiment of the present invention, the tester 100 may include an open architecture PXI bus 25. The open architecture PXI bus 25 may reduce a requirement for the design of a system bus.

In another example embodiment of the present invention, the tester 100 may include a plurality of PXI modules 26.

In another example embodiment of the present invention, the PXI bus 25 may include a module-type platform including a PCI bus.

In another example embodiment of the present invention, the PCI bus may be a standard bus (e.g., as is widely used in desktop computers).

In another example embodiment of the present invention, the data transmission speed of the PXI bus 25 may be 133 Mbyte/s.

In another example embodiment of the present invention, a controller 21 may control PXI modules 26 on a single PXI bus 25.

In the example embodiment of FIGS. 1 and 2, the digitizer 24 may convert the analog signal received from the DAC 91 of the semiconductor device 90 into a digital signal. The digitizer 24 may transmit the converted digital signal to the controller 21 through the PXI bus 25.

In the example embodiment of FIGS. 1 and 2, the digitizer 24 may include an audio digitizer and/or a video digitizer. In an example, the audio digitizer may operate at a speed of 45 kHz/24 bit or less. In another example, the video digitizer may operate at a speed of 100 Mhz/8 bit or less.

In the example embodiment of FIGS. 1 and 2, the controller 21 may control the tester 100. The controller 21 may be connected to the handler 71 through an interface (e.g., general purpose interface bus (GPIB) 72) and may transmit and/or receive a signal as required for testing via the handler 71. The controller 21 may determine test passing or failure of the semiconductor device 90 based on signals received from the digital channel 23 and/or the digitizer 24. The signals may be transmitted to the handler 71 through the GPIB 72. The handler 71 may perform operations on the semiconductor device 90 based on a signal indicating the test passing or failure received from the controller 21.

In another example embodiment of the present invention, the controller 21 may include an operating system (OS) (e.g., Windows XP). A computer programming language (e.g., C++) compatible with the OS (e.g., Windows XP) may be used in programming a test program for the tester 100.

In another example embodiment of the present invention, an operator may control the tester 100 directly through the controller 21. Alternatively, in another example embodiment of the present invention, the operator may control the controller 21 indirectly through a computer to user interface (e.g., including a monitor 61, mouse 62, and/or keyboard 63) to ensure correct input of a test program at the tester 100 and/or the test status of the tester 100.

In another example embodiment of the present invention, the PXI module 26 may further include a voltage source, a voltmeter, a timing measurement system (TMS), and/or a relay control. The PXI module 26 may be expanded to include any number of the above-described devices and/or different devices.

Figure 3:
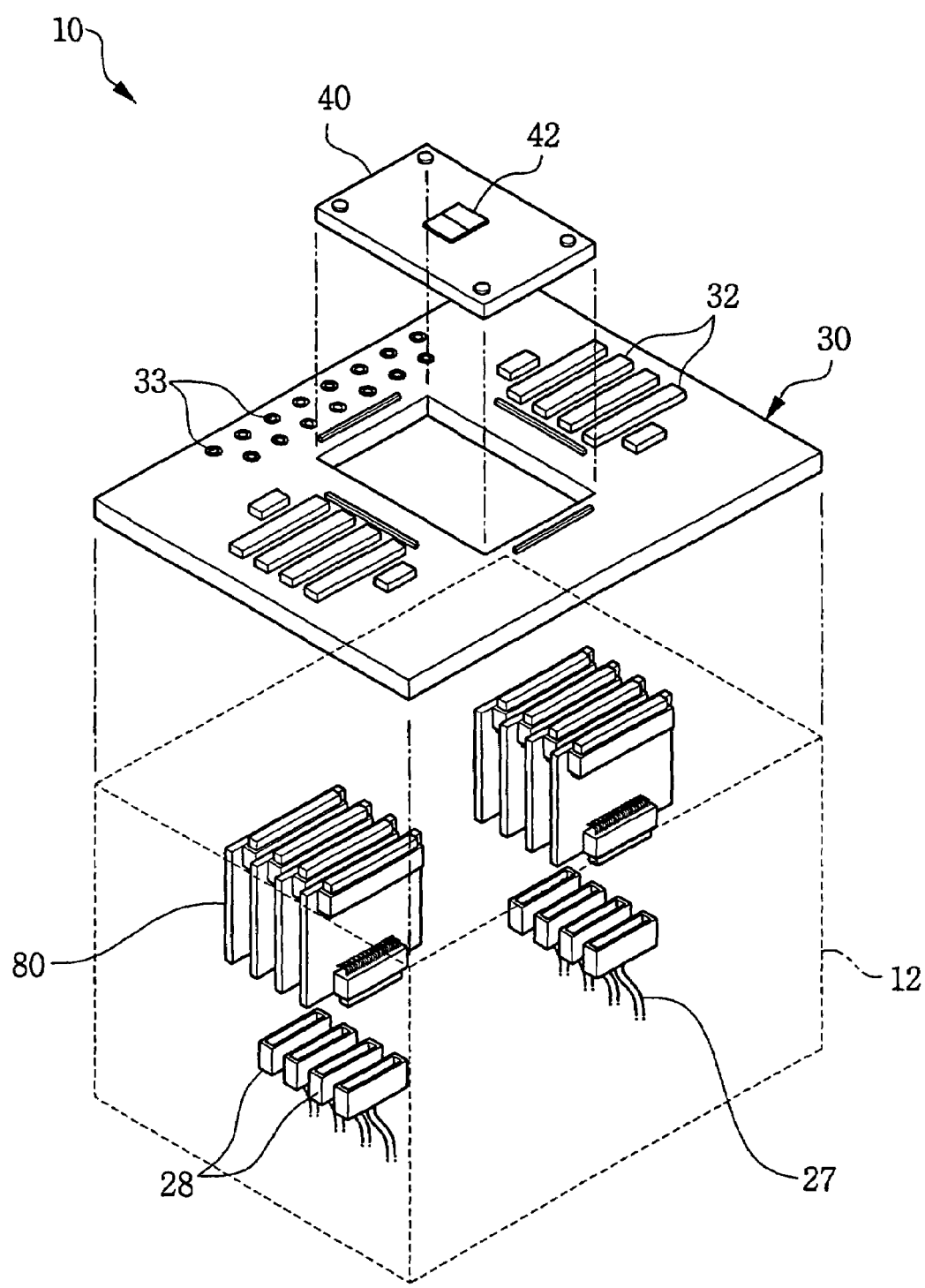
FIGS. 3 through 5 illustrate forming a connection between a Peripheral Component Interconnect (PCI) Bus Extension for Instrumentation (PXI) chassis and a device under test (DUT) board according to another example embodiment of the present invention.
Figure 4:
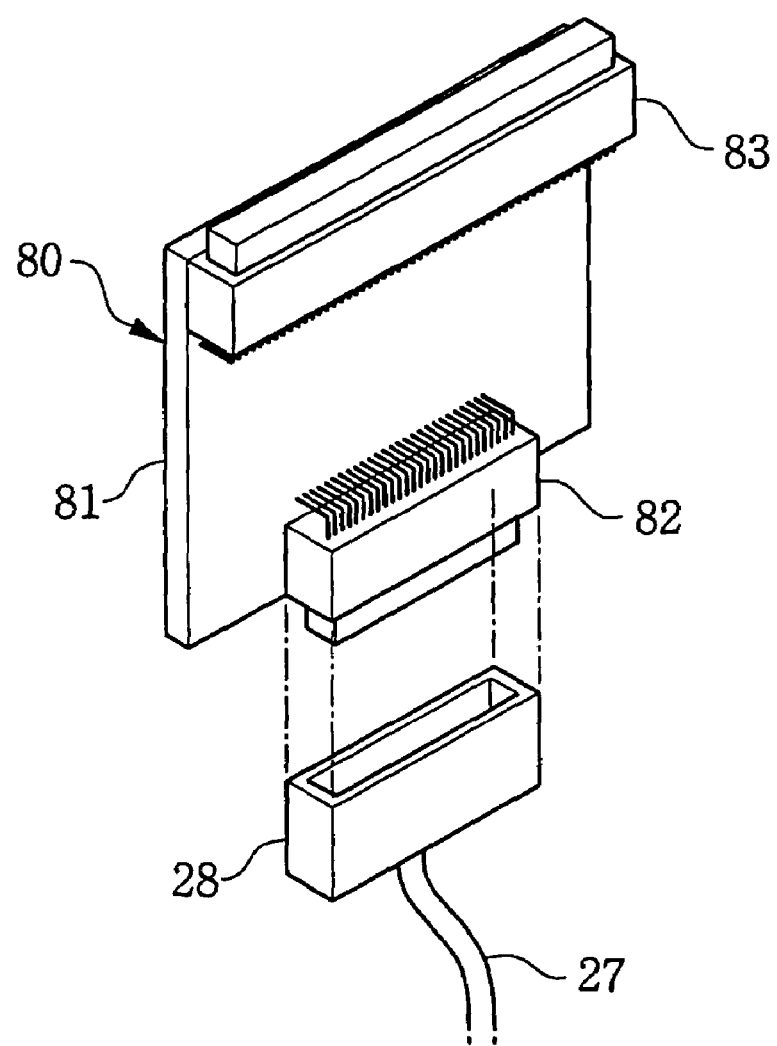
Figure 5:
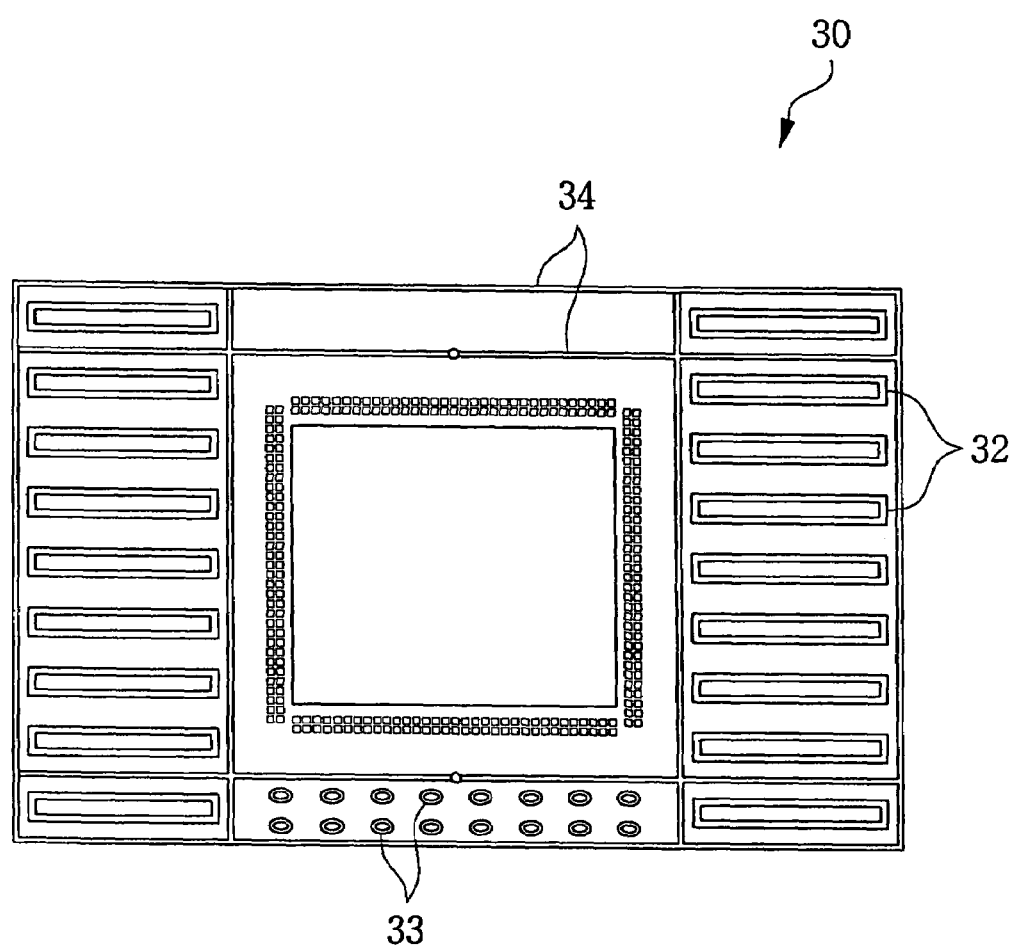

FIGS. 3 through 5 illustrate forming a connection between the PXI chassis 20 and the DUT board 40 according to another example embodiment of the present invention.

Referring to FIG. 3, the DUT board 40 may include a test socket 42 for connecting to the semiconductor device 90 (shown in FIG. 1). The motherboard 30 may be installed on a head body 12 of the test head 10. A manipulator (not shown) may vertically move a portion or the entirety of the test head 10 including the motherboard 30 to connect the test head 10 with the handler 71. The DUT board 40 may be formed on the motherboard 30 (e.g., at the center of the motherboard 30).

As shown in FIGS. 3 and 4, the cable 27 may be connected to the motherboard 30 through a support board 80 of the PXI chassis 20. The support board 80 may be installed perpendicular to the motherboard 30.

As shown in FIGS. 3 and 5, the motherboard 30 may include sockets 32 formed symmetrically with regard to the DUT board 40. The sockets 32 may disperse force which may be transferred to the motherboard 30 when the support board 80 is installed on the motherboard 30.

As shown in FIG. 4, a connector 83 of the support board 80 may be inserted into the board socket 32.

As shown in FIG. 5, the motherboard 30 may include a frame 34 (e.g., formed on the bottom surface of the motherboard 30). The frame 34 may be formed in a grid shape. The frame 34 may reinforce the strength of the motherboard 30 and prevent and/or reduce a deformation of the motherboard 30 due to force which may be transferred by the handler 71. Reference number 33 may indicate an I/O terminal for an analog signal. The board socket 32 may be used as an I/O terminal for a digital signal (e.g., a digital channel).

Referring again to FIG. 4, the support board 80 may include a body 81, a cable connector 82 formed at one end of the body 81, and the board connector 83 formed at another end of the body 81 (e.g., opposite to the one end of the body 81). A cable socket 28 may be inserted into the cable connector 82. The board socket 32 may be inserted into the board connector 83. The cable connector 82 and the board connector 83 may each be formed in the shape of a bracket (e.g., "¬").

A general method of performing a mixed signal test (e.g., including both of an ADC and a DAC) on the semiconductor device 90 with the tester 100 according to another example embodiment of the present invention will now be described with reference to FIGS. 1 through 5.

In the example testing method, an analog signal may be received by the semiconductor device 90 from the motherboard 30. The semiconductor device 90 may convert the received analog signal into a digital signal at the ADC 92. The semiconductor device 90 may output the converted digital signal from the ADC 92 back to the motherboard 30. A digital signal may be received by the semiconductor device 90 from the motherboard 30. The semiconductor device 90 may convert the received digital signal into an analog signal at the DAC 91. The semiconductor device 90 may output the converted analog signal from the DAC 91 back to the motherboard 30.

Although the above-given example embodiment illustrate the semiconductor device 90 including both a DAC 91 and an ADC 92, the semiconductor device 90 may include both and/or either of the DAC 91 and the ADC 92.

In another example embodiment of the present invention, referring to FIGS. 1 and 2, the test head 10 may be moved upwards by a manipulator (not shown) so that the DUT board 40 may be connected (e.g., in contact) with the handler 71.

A method for testing an ADC function of the semiconductor device 90 with the tester 100 according to another example embodiment of the present invention will now be described with reference to FIGS. 1 through 5.

In the example ADC function testing method, the analog source generator 22 may output an analog signal through the motherboard 30 to the ADC 92 of the semiconductor device 90. The controller 21 may transmit a signal to the analog source generator 22 through the PXI bus 25. The transmitted signal received by the analog source generator 22 may trigger the output of the analog signal through the motherboard 30 to the ADC 92 of the semiconductor device 90.

A digital signal from the ADC 92 of the semiconductor device 90 may be received by the digital channel 23 through the motherboard 30. The digital channel 23 may transmit the received digital signal to the controller 21 through the PXI bus 25. The controller 21 may analyze the digital signal to determine test passing or failure with respect to the ADC function of the semiconductor device 90.

A method for testing a DAC function of the semiconductor device 90 with the tester 100 according to another example embodiment of the present invention will now be described with reference to FIGS. 1 through 5.

In the example DAC function testing method, the digital channel 23 may output a digital signal to the DAC 91 of the semiconductor device 90. The controller 21 may transmit a signal to the digital channel 23 through the PXI bus 25. The transmitted signal received by the digital channel 23 may trigger the output of the digital signal through the motherboard 30 to the DAC 91 of the semiconductor device 90.

An analog signal (e.g., converted from the received digital signal) output from the DAC 91 of the semiconductor device 90 may be received by the digitizer 24. The digitizer 24 may analyze the received analog signal and store it as a file. The stored file associated with the received analog signal may be transmitted to the controller 21 through the PXI bus 25.

The controller 21 may read the received stored file and analyze a noise characteristic of the analog signal through digital signal processing (DSP) to determine test passing or failure with respect to the DAC function of the semiconductor device 90.

The controller 21 may transmit a pass or fail signal of the ADC and/or DAC functions of the semiconductor device 90 to the handler 71 through the GPIB 72. The handler 71 may perform operations on the semiconductor device 90 based on the test results received from the controller 21.

In another example embodiment of the present invention, a tester (e.g., digital tester, analog tester, mixed signal tester, etc.) may test analog and/or digital signals associated with a semiconductor device. The tester need not require a conventional digital tester for correct operation. Further, the tester according to the example embodiments of the present invention may reduce costs associated with manufacturing the tester (e.g., for a mixed-signal semiconductor device).

In another example embodiment of the present invention, the PXI chassis may include a PXI bus as a system bus, thereby reducing the need for a design of the system bus. The PXI chassis may be expanded based on application specific requirements of the PXI chassis. Further, each of the modules and/or devices within the PXI chassis may be replaced, swapped and/or removed (e.g., hot swappable). Thus, rapid customization in a test environment of a developing semiconductor device may be achieved.

In another example embodiment of the present invention, a tester according to the example embodiments of the present invention may include any well-known OS (e.g., Windows XP) to facilitate the control of the tester.

The example embodiments of the present invention being thus described, it will be obvious that the same may be varied in many ways. For example, while example features of the present invention have been described with respect to certain example embodiments, it is understood that each of the features the example embodiments are useable in any combination. Such variations are not to be regarded as departure from the spirit and scope of the example embodiments of the present invention, and all such modifications as would be obvious to one skilled in the art are intended to be included within the scope of the following claims.

What is claimed is:

1. A tester for a semiconductor device, comprising:
   a test head applying a test signal to a semiconductor device and receiving a response from the semiconductor device, the test head including a hot swappable chassis including at least two modules; and
   a device under test (DUT) board electrically connecting the test head and the semiconductor device,
   wherein said at least two modules are connected to one common bus and include a digital channel and analog source generator.

2. The tester of claim 1, wherein the hot swappable chassis is a Peripheral Component Interconnect (PCI) Bus Extension for Instrumentation (PXI) chassis.

3. The tester of claim 1, wherein the at least two modules include a Peripheral Component Interconnect (PCI Bus Extension for Instrumentation (PXI) module.

4. The tester of claim 1, further comprising:
   a motherboard connecting the hot swappable chassis to the DUT board.

5. The tester of claim 1, wherein the test signal is applied by one of the at least two modules.

6. The tester of claim 1, wherein the common bus is a Peripheral Component Interconnect (PCI) Bus Extension for Instrumentation (PXI) bus.

7. The tester of claim 1, further comprising:
   a digitizer converting the analog signal into a second digital signal; and
   a controller controlling the transfer of signals of at least one of the analog source generator, digital channel, and digitizer, wherein
   the analog source generator outputs an analog signal to the semiconductor device and the digital channel transfers a first digital signal to/from the semiconductor device.

8. The tester of claim 7, wherein the controller uses a Peripheral Component Interconnect (PCI) Bus Extension for Instrumentation (PXI) bus.

9. The tester of claim 7, wherein the tester determines one of test passing and test failure of the semiconductor device.

10. The tester of claim 9, wherein the determination is based on the second digital signal.

11. The tester of claim 7, wherein the controller is connected to a handler by a general purpose interface bus (GPIB).

12. The tester of claim 1, wherein the hot swappable chassis includes a cable connected to a support board on a motherboard.

13. The tester of claim 12, wherein the support board includes a body and a connector including a first end connected to the cable and a second end connected to the motherboard.

14. The tester of claim 12, wherein the motherboard includes a frame formed on a bottom surface of the motherboard.

15. The tester of claim 14, wherein the frame includes a grid shape.

16. The tester of claim 1, wherein the at least two modules include a first module for testing an analog-to-digital conversion (ADC) of the semiconductor device and a second module for testing a digital-to-analog conversion (DAC) of the semiconductor device.

17. A tester for a semiconductor device, comprising:
   a first module for testing an analog-to-digital conversion (ADC) of the semiconductor device; and
   a second module for testing a digital-to-analog conversion (DAC) of the semiconductor device, the first and second modules capable of being hot swappable,
   wherein the first and second modules are connected to one common bus.

18. The tester of claim 17, further comprising:
   a controller connected to the first and second modules, the controller determining whether the semiconductor device passes a test based on a response from the semiconductor device.

19. The tester of claim 17, further comprising:
   a plurality of additional modules associated with a testing operation of the semiconductor device.

* * * * *